United States Patent [19]

Valdettaro

[11] E Re. 30,062

[45] Reissued Aug. 7, 1979

[54] ELONGATED STRIP TYPE INDICATOR ARRANGEMENT FOR UHF TELEVISION TUNER

[75] Inventor: Alarico A. Valdettaro, Bloomington, Ind.

[73] Assignee: Sarkes Tarzian, Inc., Bloomington, Ind.

[21] Appl. No.: 848,772

[22] Filed: Nov. 4, 1977

Related U.S. Patent Documents

Reissue of:

[64] Patent No.: 3,916,820
Issued: Nov. 4, 1975
Appl. No.: 257,846
Filed: May 30, 1972

[51] Int. Cl.[2] ..... H03J 1/02; H03J 5/04

[52] U.S. Cl. .....116/243; 116/263; 116/DIG. 29; 325/455; 334/86

[58] Field of Search ..... 116/124.2 R, 124.1 A, 116/DIG. 29; 334/86–88, 89, 82; 74/10.41, 10.8; 325/455

[56] References Cited

U.S. PATENT DOCUMENTS

| | | | |
|---|---|---|---|
| 1,150,314 | 8/1915 | Stephens | 40/117 |
| 1,999,133 | 8/1935 | Shapiro | 40/364 |
| 2,130,153 | 9/1938 | Plensler | 334/86 X |
| 2,530,191 | 11/1950 | Clouez | 235/71 |
| 2,746,419 | 5/1956 | Serge | 116/124.1 R |
| 2,931,333 | 4/1960 | Whittier | 116/124.2 R X |
| 2,942,108 | 6/1960 | Goldstein et al. | 334/86 X |
| 2,983,885 | 5/1961 | Thompson | 334/86 X |
| 3,285,078 | 11/1966 | Siebold | 116/124.1 R X |
| 3,376,846 | 4/1968 | Sekiguchi et al. | 116/124.1 R |
| 3,397,590 | 8/1968 | Prentice | 74/10.8 |
| 3,477,299 | 11/1969 | Speer et al. | 74/10.41 |
| 3,665,825 | 5/1972 | Friedel | 95/4.5 |
| 3,689,853 | 9/1972 | Badger et al. | 334/87 |
| 3,774,459 | 11/1973 | Valdettaro | 74/10.41 X |
| 3,842,683 | 10/1974 | Valdettaro | 116/124.2 R |
| 3,919,966 | 11/1975 | Saruwatari | 334/86 X |
| 3,973,229 | 8/1976 | Weigel | 334/88 X |

FOREIGN PATENT DOCUMENTS

| | | | |
|---|---|---|---|
| 778938 | 2/1968 | Canada | 334/86 |
| 437237 | 10/1935 | United Kingdom . | |

*Primary Examiner*—Daniel M. Yasich
*Attorney, Agent, or Firm*—Mason, Kolehmainen, Rathburn & Wyss

[57] ABSTRACT

A compact dial indicator arrangement is provided for a UHF tuner of the type having a continuously variable main tuning shaft and a station selector shaft provided with detent means for establishing a separate detent position for each of the 70 television stations in the UHF band. An elongated strip of material bearing numbers corresponding to each one of the 70 UHF television stations is moved past a viewing position at which the selected channel numbers may be viewed by means interconnected with the detented selector shaft so that the number on the elongated strip corresponding to each stop position of the continuously variable main tuning shaft is automatically viewable at the viewing position in response to rotation of the selector shaft to each detented position thereof.

21 Claims, 16 Drawing Figures

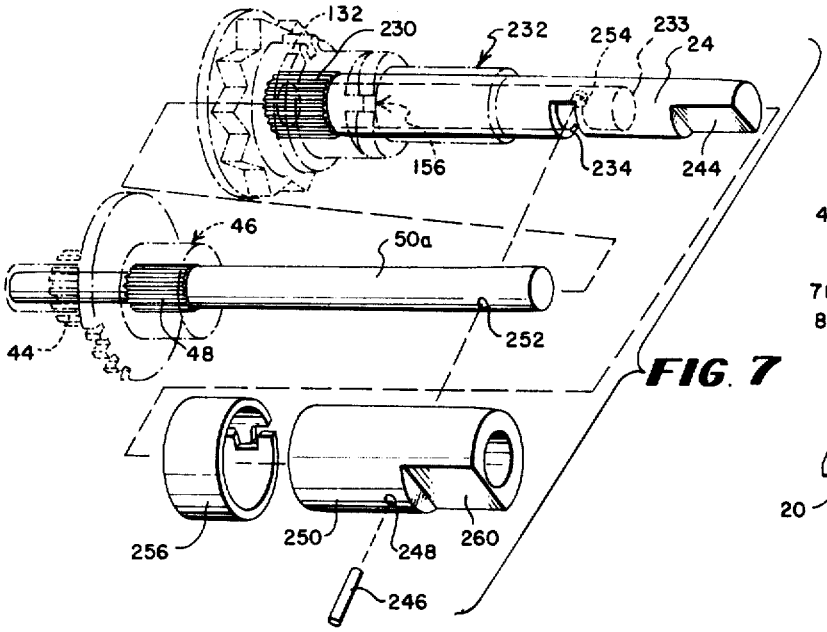
FIG. 7
FIG. 6
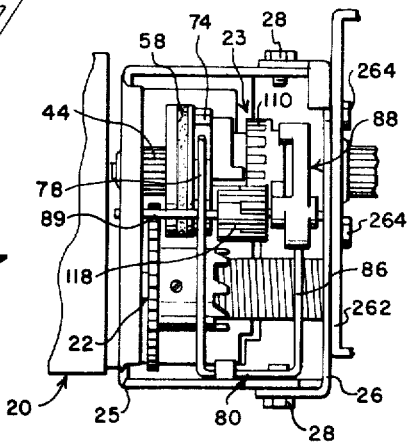
FIG. 16
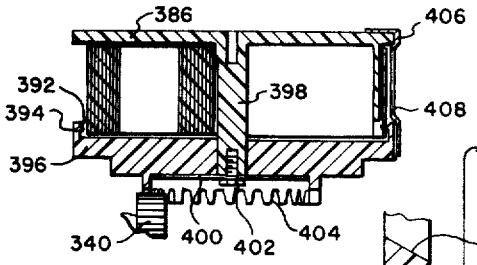
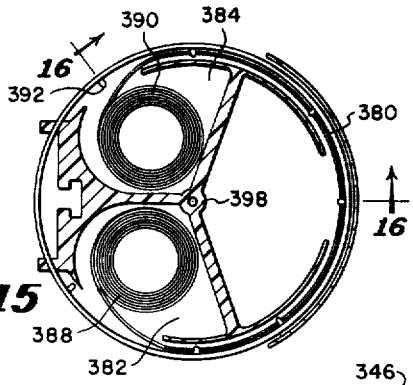
FIG. 15
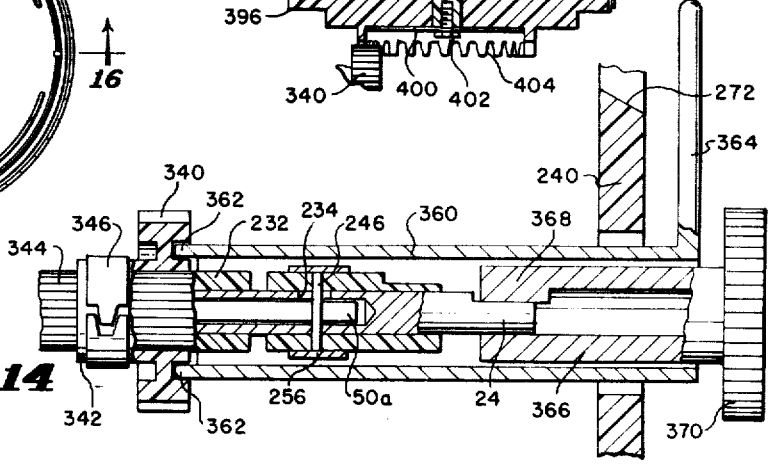
FIG. 14
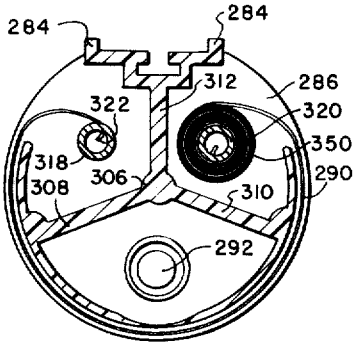
FIG. 11
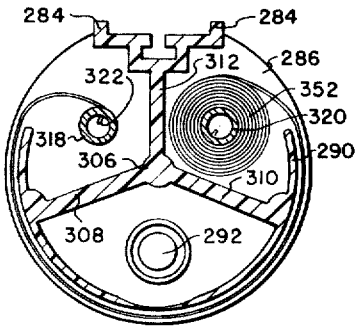
FIG. 12
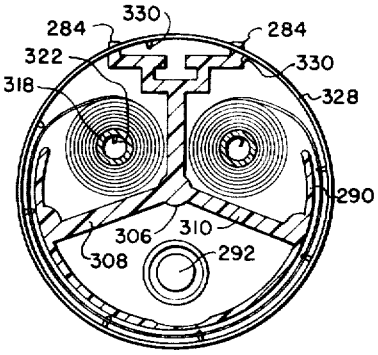
FIG. 13

ELONGATED STRIP TYPE INDICATOR ARRANGEMENT FOR UHF TELEVISION TUNER

Matter enclosed in heavy brackets [ ] appears in the original patent but forms no part of this reissue specification; matter printed in italics indicates the additions made by reissue.

The present invention relates to UHF tuners of the type having a continuously variable main tuning shaft interconnected with a detented station selector shaft so that equally spaced detent positions are provided for each one of the 70 television stations in the UHF band, and, more particularly, to a compact, inexpensive dial indicator arrangement for displaying the channel number of each UHF television station automatically in response to rotation of the station selector shaft and in a manner which is visually comparable in all respects to the channel indication normally provided for VHF television stations.

Various types of dial indicator arrangements have been provided in the past for UHF tuners of the type having a continuously variable main tuning shaft. In copending Valdettaro application Ser. No. 174,722 filed Aug. 25, 1971, now abandoned, for a corresponding continuation application Ser. No. 350,742, having now issued as U.S. Pat. No. 3,842,683, a number of such dial indicator arrangements for UHF tuners are discussed and are incorporated herein by reference. In said copending Valdettaro application a highly accurate detent mechanism is employed to provide a separate detent position for each one of the 70 television stations in the UHF television band and a nonambiguous digital dial arrangement is employed to indicate to the operator exactly which UHF station is being received. This digital dial arrangement comprises a first or decade indicator disc which bears the tens digits of the UHF channels numbers and a separate units disc which bears the units digit of these channel numbers, both of these tens and units discs being compositely viewed at a viewing station to inform the operator of the exact UHF television station being received corresponding to each detent position of the station selector shaft.

While such a composite tens and units disc dial indicator arrangement is entirely satisfactory for its intended purpose, problems of accurate registration of the two discs may arise. If the two digits of a particular channel number are not accurately registered with respect to each other, some of the channel numbers may become difficult for the operator to read. Also, when the tens and units discs are positioned concentrically, the set of numbers on one of the discs must be viewed through the other disc with the result that the two digits of a particular channel number are not of the same intensity to the viewer. Furthermore, problems of illuminating these composite numbers to a high degree of illumination may arise with certain television cabinet structures. Also, with the dial indicator arrangements shown in the above-identified copending Valdettaro application, and in the prior art references referred to therein, the UHF tuner and dial indicator must be mounted with a particular orientation to the television cabinet in order to provide proper reading of the channel numbers, which limits the angular orientations and possibilities of mounting the UHF tuner in different orientations within a given television cabinet. In addition, dial calibration is difficult with these prior art arrangements, particularly after the television receiver chassis has been installed in its cabinet.

It is, therefore, an object of the present invention to provide a new and improved dial indicator arrangement for UHF tuners wherein one or more of the above-discussed disadvantages of prior art arrangements is eliminated or avoided.

It is a further object of the present invention to provide a new and improved dial indicator arrangement for UHF tuners which is extremely compact and yet provides large channel numbers corresponding to each of the 70 UHF television stations which are individually and automatically moved to a viewing position in response to movement of a detented station selector shaft of the tuner to a particular UHF channel.

It is another object of the present invention to provide a new and improved dial arrangement for UHF tuners wherein separate channel numbers corresponding to each one of the 70 UHF television stations are automatically moved to a viewing position in response to manipulation of a detented station selector shaft and means are provided for adjusting the calibration of the channel numbers relative to the selector shaft, said means being accessible from the front panel of the television cabinet after the tuner has been installed in the television receiver chassis and the receiver chassis has been installed in the cabinet.

It is still another object of the present invention to provide a new and improved dial arrangement for UHF tuners wherein separate channel numbers corresponding to each one of the 70 UHF stations are automatically moved to a viewing position in response to manipulation of a detented station selector shaft while facilities are provided for mounting the UHF tuner and its associated drive mechanism at any angular orientation within the television cabinet while at the same time providing horizontal orientation of the digits of each UHF channel number.

It is a further object of the present invention to provide a new and improved dial indicator arrangement for UHF tuners which is compact and yet provides display of large channel numbers corresponding to each UHF station, is relatively inexpensive to manufacture, and wherein the channel number visible in a viewing position can be readily illuminated, and the light for such illumination contained within the channel number viewing area.

It is another object of the present invention to provide a new and improved dial indicator arrangement for a UHF tuner wherein an elongated strip of material is provided on which separate numbers corresponding to each UHF station are spaced along the length of this strip and wherein facilities are provided for advancing the strip to a viewing position at which the channel number corresponding to the selected UHF station is automatically viewable in response to rotation of the station selector shaft to a particular detented position corresponding to that station.

Briefly, in accordance with the present invention, an elongated strip of material is provided which carries large channel numbers corresponding to each one of the 70 UHF channels and of a size comparable to the channel number indication in conventional VHF tuners. These UHF channel numbers are spaced uniformly along the length of the elongated strip and are successively moved to a viewing position in which the selected channel number can be viewed, by means of a sprocket drive arrangement which cooperates with sprocket holes in one edge of the strip and is directly interconnected with the detented station selector shaft of the UHF tuner drive mechanism. The UHF tuner and its associated drive mechanism may be oriented at any desired angular position within the television cabinet and the channel numbers simply imprinted on the strip at the correct angle to maintain the desired horizontal orientation of the digits of these numbers. Furthermore, facilities are provided for adjusting the calibration or registration of the channel number bearing strip with respect to the station selector shaft from the front panel of the television cabinet after the tuner has been assembled therein.

In accordance with a preferred embodiment of the invention, the ends of the elongated strip are secured to takeup and supply spools which are directly driven in synchronism with the selector shaft. The elongated strip is moved by engagement of a sprocket mechanism positioned between the two spools which engages sprocket holes in one side of the channel number bearing strip. However, the spools are initially set so that the elongated strip remains loosely coiled on both spools throughout movement in either direction through the entire UHF band without binding on the spools which are driven at constant speed from the selector shaft.

In accordance with a still further aspect of the invention, the elongated strip may be made of deformable material and given a prestressed or preset curl so that it may be driven by a centrally located sprocket member and the ends thereof will be maintained in coiled form without the use of spools driven at constant speed and while still providing an extremely compact dial indicator arrangement.

The invention both as to its organization and method of operation, together with further objects and advantages thereof, will best be understood by reference to the following specification taken in connection with the accompanying drawings in which:

FIG. 6 is a fragmentary bottom view taken along the lines 6—6 of FIG. 1;

FIG. 7 is an exploded view of the fine tuning and selector shaft arrangement employed in the mechanism of FIG. 1;

FIGS. 11, 12 and 13 are sectional views taken along the lines 11—11 of FIG. 3 and showing the manner in which the indicator strip is initially positioned during assembly to prevent binding or jamming during use;

FIG. 14 is a fragmentary sectional side elevational view of the embodiment of FIG. 1 showing the manner in which the dial indicator may be adjusted relative to the selector shaft after the television chassis has been positioned in its cabinet;

FIG. 15 is a top plan view of an alternative dial indicator arrangement of the present invention in which the supply and takeup spools are eliminated; and FIG. 16 is a sectional view taken along the lines 16—16 of FIG. 15.

Figure 1:
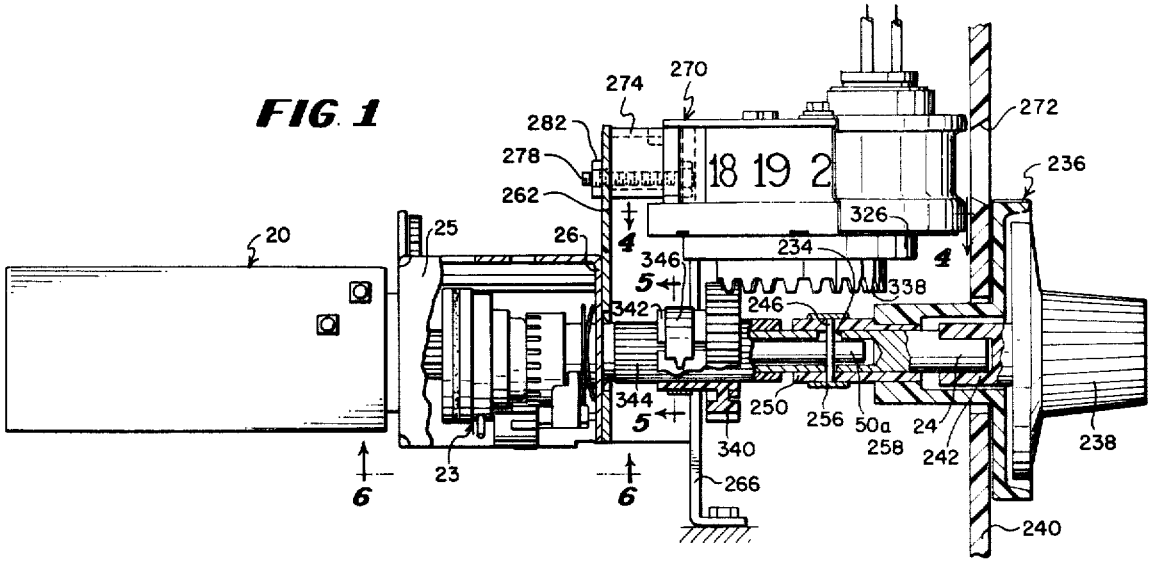
FIG. 1 is a left side view of a UHF tuning mechanism and dial indicator arrangement embodying the principles of the present invention.
Figure 2:
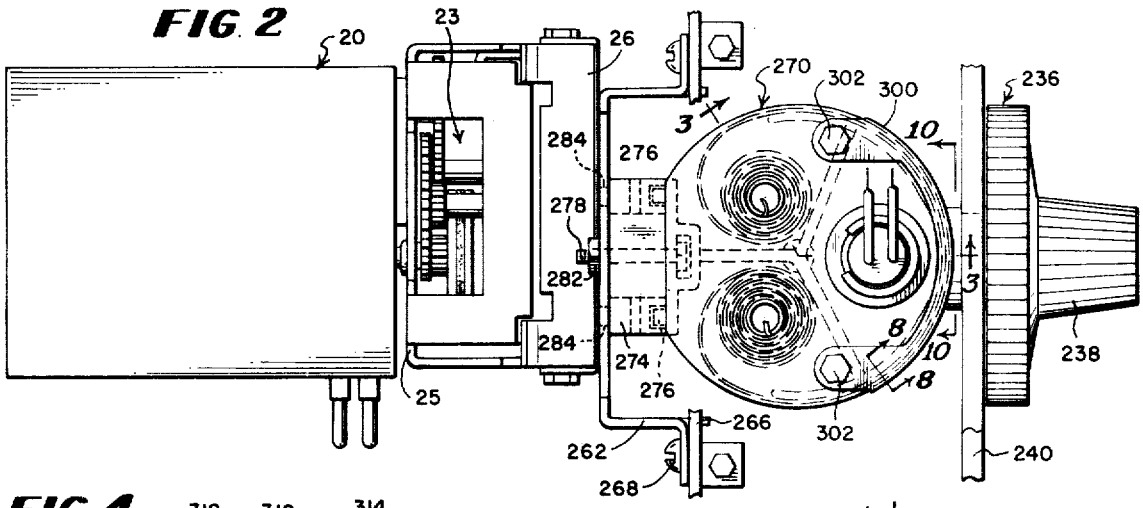
FIG. 2 is a top plan view of the arrangement of FIG. 1.
Figure 4:
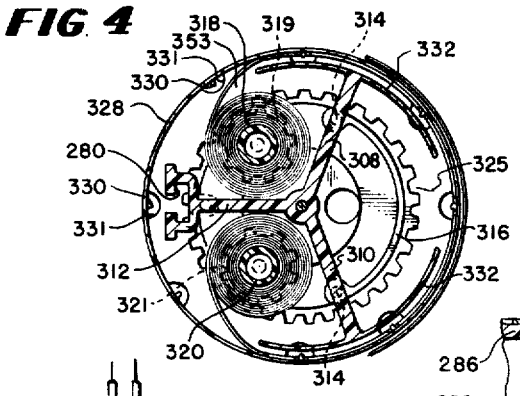
FIG. 4 is a sectional view taken along the lines 4—4 of FIG. 1.
Figure 3:
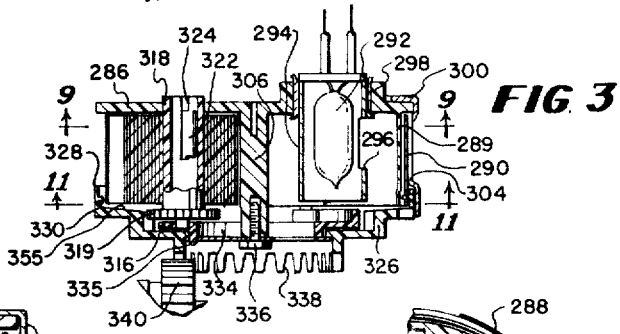
FIG. 3 is a sectional view taken along the lines 3—3 of FIG. 2.
Figure 10:
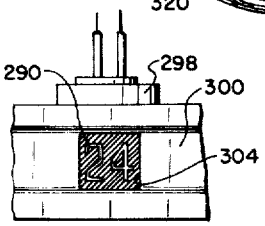
FIG. 10 is a fragmentary front view taken along the lines 10—10 of FIG. 2.

Referring now to the drawings, and more particularly to FIGS. 1 to 14, inclusive, thereof, the UHF tuning mechanism of the present invention is therein illustrated in conjunction with a UHF tuner 20 which is of the continuously variable type and is provided with a rotor shaft 22 (FIG. 6) rotation of which over an arc of approximately 180° is effective selectively to receive any one of the 70 UHF television stations. The rotor shaft 22 is connected to the station selector shaft 24 of the tuner mechanism by means of a gearing and counter stop mechanism indicated generally at 23, which is contained within a two-piece bracket arrangement comprising a main rear bracket 25 and a front bracket 26, these brackets being secured together by means of the screws 28 (FIG. 6). The mechanism 23 is substantially identical to the corresponding mechanism described in copending Valdettaro application Ser. No. 233,148, filed Mar. 9, 1972, now U.S. Pat. No. 3,774,457, which description is incorporated herein by reference, with the exception that the tripper gear 118 (FIG. 6) is mounted on the same shaft 89 on which the stop lever 88 is rotatably mounted. This is because in the arrangement of the present invention the separate tens and units dial indicator discs provided in copending Valdettaro application Ser. No. 233,148 are eliminated and hence a separate outboard driving gear for the tens disc disclosed in this copending Valdettaro application is not required. While reference may be had to said copending Valdettaro application Ser. No. 233,148 for a complete and detailed description of the gearing and counter stop mechanism 23, it may be stated generally that the rotor 22 is connected through suitable step up gearing to an input gear 44 which is formed in a plastic member 46 (FIG. 7) secured to the knurled end portion 48 of the fine tuning shaft 50a, the rear end portion of the member 46 being journaled in the rear bracket 25. In the arrangement of the present invention, the selector shaft 24 is of metal and is provided with a knurled portion 230 on which is press fitted a plastic member 232 these two members 230 and 232 when assembled together being equivalent to the selector shaft described in copending Valdettaro application Ser. No. 233,148. Thus, the member 232 is provided with a series of ten detent lobes 74 (FIG. 6) which cooperate with the V-shaped end portion of the detent spring 78 to provide ten equally spaced detent positions for the selector shaft 24 during each full revolution thereof. The member 232 also has formed therein the elongated one-toothed gear element 132 which cooperates with the arming cam member 110 (FIG. 6) through the tripping gear 118 to move the arming cam member 110 one increment for each full revolution of the selector shaft 24. The arming cam member 110 controls the position of the stop lever 88 so that this lever is moved to an arming position adjacent each end of the UHF band and engages the stop lug portion 156 (FIG. 7) of the member 232 so as to provide a positive stop for the selector shaft 24 at each end of the UHF band.

In the embodiment of FIGS. 1 to 14, inclusive, a control shaft and knob arrangement is employed so that the fine tuning knob indicated generally at 236 is positioned outside of the selector knob 238 so that a tuning knob arrangement entirely comparable with conventional VHF tuners is provided. More particularly, the selector knob 238 which is positioned outside of the front panel 240 of the television cabinet, is provided with a shank portion 242 which engages a flat 244 (FIG. 7) on the end of the selector shaft 24. The selector shaft 24 is hollow to a point 233 adjacent a transverse arcuate opening 234 therein and the fine tuning control shaft 50a fits inside this hollow portion of the selector shaft 24. A pin 246 extends through an opening 248 in a fine tuning sleeve 250 which is rotatably mounted on the outside of the selector shaft 24, the pin 246 extending through the arcuate opening 234 and into an opening 252 in the control shaft 50a. With this arrangement the control sleeve 250 and the control shaft 50a may be rotated as a unit independently of the shaft 24 and through a limited number of degrees determined by the arcuate extent of the opening 234 in the selector shaft 24. The selector shaft 24 is provided with an opening 254 so that the pin 246 may be readily removed to permit disassembly of the parts. An annular spring collar 256 is slipped over the fine tuning sleeve 250 and over the opening 248 therein so as to prevent removal of the pin 246 under normal operating conditions. The fine tuning knob 236 is provided with a shank portion 258 (FIG. 1) which engages a flat 260 on the fine tuning sleeve 250. Accordingly, when the station selector knob 238 is rotated to any desired UHF station position within the UHF band, the outer fine tuning knob 236 may then be rotated while the clutch element 58 slips so that a fine tuning adjustment of the gear 44, and hence of the rotor shaft 22, can be made, as described in more detail in said copending Valdettaro application Ser. No. 233,148.

Considering now in more detail the dial indicator arrangement of the present invention, a generally U-shaped bracket 262 is secured to the front bracket 26 of the gearing and counter stop mechanism 23 by means of the screws 264 (FIG. 6) and the bracket 262 is mounted on an upstanding partition portion 266 of the television receiver chassis by means of the screws 268. The partition 266 is spaced from the front panel 240 of the television cabinet by an amount sufficient to position a drum-like support indicated generally at 270 so that the forward portion of this support is immediately behind a viewing window 272 in the front panel 240. More particularly, the drum support 270 is interlocked with a spacer member 274 (FIG. 2) by means of interfitting lugs 276 on the drum support 270 and corresponding recesses in the spacer 274, both the support 270 and the spacer 274 being secured to the bracket 262 by means of a bolt 278 the head of which fits within a vertically extending bottom opening groove 280 (FIG. 4) formed in the drum support 270, a nut 282 being employed to secure the entire assembly to the bracket 262 with the desired orientation with respect to the viewing window 272. With this arrangement, spacers 274 of various dimensions may be employed for different television receiver cabinets wherein the front panel 240 may be spaced at different distances from the mounting partition 266. The spacer 274 is also located with respect to the bracket 262 by means of lug portions 284 on the spacer 274 which extend through corresponding openings in the bracket 262. The drum support assembly 270 may thus be readily removed by simply removing the nut 282.

The drum support assembly 270 comprises a circular shell or housing 286 of translucent plastic which is provided with an arcuate downwardly depending skirt portion 288 (FIG. 8) over which an elongated strip type indicator 290 may be moved. The skirt portion 288 has a relatively thin portion 289 (FIG. 9) therein opposite a pilot light 292 which is mounted within a tubular housing 294 having an arcuate opening 296 therein adjacent the thin wall portion 289, the tube 294 being mounted in a boss portion 298 of the housing 286. A light mask 300 is secured to the housing 286 by means of the screws 302 and extends around the arcuate periphery of the skirt portion 288 for a distance on either side of the thin wall portion 290 but is spaced therefrom by an amount sufficient to permit movement of the elongated strip 290, the mask 300 being provided with a viewing aperture 304 (FIG. 10) through which the channel number corresponding to the particular UHF station to which the selector knob 238 is moved may be viewed by the operator. Preferably, the background of the elongated strip 290 is dark and the channel numbers are transparent so that light from the pilot light 292 which passes through the translucent thin wall portion 289 issues through the transparent portions of the strip 290 and is viewed through the windows 304 and 272. A suitable arrangement is one in which a transparent strip is coated with a black emulsion except in the areas of the channel numbers. This emulsion is preferably applied on the outer surface of the strip 290 so that it is not worn off by sliding engagement with the skirt portion 288. However, it will also be understood that white channel numbers may be painted or otherwise imprinted on a black strip 290 and these members viewed by ambient light or by a light from the front of the cabinet, in which case the pilot light 292 may be eliminated and the housing 286 may be made of opaque material. As a further alternative arrangement, the light mask 300 may be eliminated, the housing 286 may be made of a material which is non-contrasting with the background of the elongated strip 290, such as black if the background of the strip 290 is black, and a portion of the area 289 just slightly larger than one of the transparent channel members may be painted a highly contrasting color, or a white label applied to this area, so that each successive channel number is eliminated by ambient light shining through the transparent portion of the strip 290 and striking the highly contrasting area therebehind.

The housing 286 is provided with a downwardly extending center post portion 306 and three radially extending arm portions 308, 310 and 312. These arm portions are provided with downwardly extending lugs 314 which register an annular bottom ring 316 so that a pair of pickup and supply spools 318, 320 may be rotatably supported in the upper wall of the housing 286 and in the bottom ring 316. The ends of the elongated channel indicator strip 290 are secured to the spools 318, 320 by inserting a tab portion 322 thereof in a vertically extending slot 324 provided in the upper end of each of the spools 318 and 320 and the strip 290 is contained at the bottom thereof by means of a rotatable strip drive member 326. The member 326 is provided with an upstanding flange 328 at the outer periphery thereof which is provided with inwardly extending lug portions 330 which are adapted to enter corresponding perforations in the bottom edge of the strip 290 so that as the member 326 is rotated, the lugs 330 enter these apertures in the strip 290 and move this strip past the viewing position 304. The member 326 is preferably provided with semicircular openings 331 around each of the drive lugs 330 for simplicity in molding this part in plastic.

Figure 8:
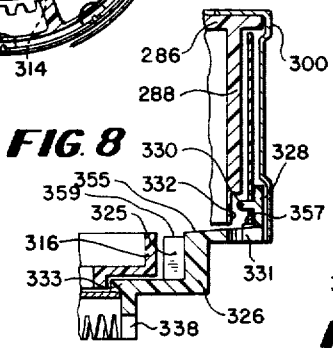
FIG. 8 is a sectional view taken along the lines 8—8 of FIG. 2.

As is best illustrated in FIG. 8, the arcuate skirt portion 288 is provided with an undercut portion 332 at the bottom edge thereof to provide clearance for the strip engaging lugs 330 as the member 326 is rotated. The member 326 is rotatably mounted by engagement of an inturned flange portion 333 thereof with the edge of a retainer disc 334 which is secured to the center post 306 by means of the screw 336 and is prevented from rotating with the member 326 by means of a downwardly projecting lug 335 on the ring 316 which lug extends through a corresponding opening in the retainer disc 334.

The spools 318 and 320 are provided with gear portions 319 and 321, respectively, below the level of the strip 290 which are in mesh with an internal gear portion 325 (FIG. 4) formed in the inner edge of the annular film drive member 326. Accordingly, as the member 326 is rotated, the spools 318 and 320 are continuously moved in exact synchronism therewith after the parts are assembled and the gears 319, 321 meshed with the gear 325.

In order to move the strip 290 past the viewing position 304 in synchronism with rotation of the selector knob 238, the member 326 is provided with a downwardly depending crown gear portion 338 which is in mesh with a pinion gear 340 having a split hub portion 342 (FIG. 1) which is secured to the splined portion 344 of the member 232 immediately ahead of the bracket 262, a spring clamping band 346 being positioned around the hub portion 342 to hold the gear 340 in adjusted position on the selector shaft 24.

When the selector knob 238 is moved from one detented position to another, the gear 340 rotates the member 326 by engagement with the crown gear 338 and the lugs 330 which are positioned in certain ones of the sprocket holes in the strip 290 throughout the length of the skirt portion 288, move the strip 290 by the correct amount to position the next channel number within the viewing opening 304 so that this number is now visible to the operator and he is immediately informed of the UHF station to which the knob 238 has been moved.

In a specific physical embodiment of the invention, the flange portion 328 of the drive member 326 had an inner diameter of 2 inches and the sprocket holes in the strip 290 were spaced apart by 0.3 inches. Under these conditions it was found that four drive lugs spaced 90° apart were unsuitable to drive the strip 290 in an accurate and reliable manner. Accordingly, a series of eight drive lugs 330 are provided in the flange portion 328 of the drive member 326. Since in this physical embodiment the sprocket holes were not an even multiple of the circumference of the flange 328, the drive lugs 330 are positioned around the flange 328 so that they are spaced alternately two sprocket holes and then three sprocket holes apart around this flange. However, it will be understood that any other suitable drive lug and sprocket hole combination may be employed so long as a positive and reliable movement of the strip 290 past the viewing window 304 is provided by the drive lugs which engage the film over the area of the skirt portion 288.

In said physical embodiment the strip 290 was also arranged to move 0.480 inches for each detent position of the selector shaft 24, i.e., for each one-tenth revolution of this shaft. Accordingly, under these conditions, the gear ratio between the gears 340 and 338 was 4 to 5. Obviously, other gear ratios can be employed with channel numbers of different sizes or spacing.

During movement of the strip 290 past the viewing window 304 it will be noted that the strip is removed from one of the spools 318, 320 and pushed into the area of the other one of these spools. However, since the channel numbers within the viewing opening 304 should be relatively large to be comparable to VHF channel numbers, and a spacing of approximately one-half inch between numbers to be displayed must be employed, the strip 290 will have a length of approximately 32 inches plus a length at each end sufficient to connect to the spools 318, 320. Also, in order that the dial indicator arrangement occupy a minimum amount of space the strip 290, which is preferably of Mylar but may also be made of acetate, has a thickness of approximately 0.004 to 0.005 inches so that a relatively large number of turns of the strip 290 may be accommodated within a small area surrounding the spools 318, 320.

With a strip 290 of a length of approximately 40 inches or more of this thickness and made of flexible material such as Mylar or acetate, it is difficult, if not impossible, to push the strip 290 into a takeup compartment if the spools are eliminated or if the spools are simply made freely rotatable by elimination of the gears 319, 321. On the other hand, since the gears 319 and 321 are driven at constant speed, the strip will build up on the takeup spool to such an amount that the effective spool diameter increases and the strip will become tightly wound on this spool and will tend to fight movement of the strip by engagement with the lugs 330. This is because the peripheral speed of the strip, as build-up on the takeup spool occurs, will continuously increase when the member 326 and the gears 319 and 321 are continuously moved in synchronism at constant speed. In order to resolve these conflicting requirements and in accordance with an important aspect of the invention, the gears 319 and 321 are initially placed in mesh with the gear 325 in such positions that the strip 290 is not wound tightly on either one of the spools 318, 320 or jammed into the compartment surrounding the spool as the member 326 moves the strip 290 to either end of the UHF band. This is accomplished by first winding the strip 290 tightly on one of the spools 318, 320, for example the spool 320 shown in FIG. 11, before the member 326 is assembled and the ring gear portion 325 of the member 326 placed in mesh with the gears 319 and 321. During this initial assembly operation the housing 286 may be inverted and placed on a jig fixture having a pair of posts over which the hollow spools 318 and 320 may be placed with sufficient friction to hold these spools in the tightly wound position shown in FIG. 11. The tightly wound spool 320 is then given a predetermined number of turns in the direction to loosen the strip on this spool, the required number of turns being sufficient that the strip 290 can be moved completely off of the spool 320 and can be loosely wound on the spool 318 without causing the strip 290 to be tightly wound on either spool or to become jammed against the walls of the compartment surrounding the spool 318 during tuning adjustment throughout the UHF band.

When the spools 318 and 320 have a diameter of .312 inches, the strip 290 has a thickness of 0.004 inches and the flange portion 328 of the member 326 has an inside diameter of two inches, the tightly coiled portion 350 of the strip 290 shown in FIG. 11 will comprise approximately 25 turns of strip material and the spool 320 should then be rotated approximately six revolutions in the clockwise direction as viewed in FIG. 11 so that the strip 290 forms a loose coil 352 (FIG. 12) around the spool 320. This rotation of the spool 320 to the position shown in FIG. 12 is performed before the member 326 is assembled and the disc 334 secured in place by means of the screw 336. With the spools 318 and 320 held in the position shown in FIG. 12, the member 326 is then assembled with the lugs 330 thereof engaging corresponding sprocket holes in the strip 290 and with the ring gear 325 in mesh with the gear portions 319 and 321 on the spools 318 and 320. When so assembled, the spools 318 and 320 will thereafter be moved in synchronism with movement of the drive member 326 as the strip 290 is moved past the viewing window 304. Accordingly, as this drive member 326 is rotated in a clockwise direction, as viewed in FIG. 13, the strip 290 will move into the compartment surrounding the spool 318 and loosely coil around this spool, as shown in FIG. 13. In this connection it will be understood that the film is moved into the compartment surrounding the spool 318 faster than this spool is rotated so that the film does not become tightly wound on the spool 318. On the other hand, during movement in this direction to the extreme end of the UHF band the strip 290 does not become jammed into the compartment surrounding the spool 318 since this spool is continuously rotating at a speed sufficient to keep the strip material coiling around the spool 318, thereby preventing the strip from being wedged or jammed against the adjacent walls 308 and 312 of the housing 286.

It will be noted that as the member 326 is rotated, the strip 290 moves in union with the member 326 until it reaches the area beyond the edge of the skirt portion 288. However, when the strip reaches an area such as the area 353 shown in FIG. 4, and with the member 326 rotating in a counterclockwise direction as viewed in FIG. 4, the strip 290 moves relative to the annular surface 355 (FIGS. 3 and 8) of the member 326 as the strip is loosely coiled around the spool 318. If, during such movement of the strip 290 relative to the member 326, the bottom edge of the strip 290 rubs or scrapes on the annular surface 355, the strip 290 is not spiralled smoothly into the compartment surrounding the spool 318 but instead is bulged outwardly and then released suddenly as the frictions developed by this rubbing or scraping are overcome, with the result that the surface of the strip 290 may be scratched and the emulsion on the outer surface thereof worn away by engagement with one of the compartment walls. To avoid this situation, and in accordance with an important feature of the present invention, the member 326 is provided with an annular surface 355 between the inner edge of the flange 328 and the internal teeth 325 which is inclined inwardly and downwardly at an angle of approximately 5° to the horizontal (FIG. 8). With such an arrangement, the bottom edge of the strip 290 is prevented from scraping or dragging on the member 326 as it moves into the spool compartment due to the clearance provided by the inclined surface 355. If desired, a flat ledge portion 357 may be provided adjacent the outer flange portion 328 thereof on which the bottom edge of the strip 290 may ride. In the alternative, the ledge 357 may be of increased height and the annular surface 355 made to extend horizontally, the desired clearance between the bottom edge of the strip 290 and the surface 355 being achieved by the increased height of the ledge 357. However, with a flat annular surface 355 a somewhat larger overall clearance is required than when this surface is inclined inwardly and downwardly. With either arrangement, it is desirable to recess the upper ends of the teeth 325, as indicated at 359 in FIG. 8, so that the inner edges of these teeth do not interfere with the strip 290 as it is moved into the compartment. In this connection, it is noted that in the arrangement of the present invention, movement of the strip 290 in sudden increments, due to the detent action of the detented selector shaft 24 and the shocks transmitted to the strip 290 as the shaft is suddenly detented at each station position thereof, also tend to relieve incidental friction between individual turns of the strip 290 and between the strip 290 and the compartment walls, thereby resulting in uniform spiralling movement of the strip within the compartment as it is moved in either direction.

While the strip 290 may thus be prevented from binding or jamming on the spools 318, 320 or the adjacent walls of the compartment as the member 326 moves the strip 290 throughout the UHF band, it is also necessary to provide a dial calibration adjustment so that the number corresponding to the first UHF channel, i.e., channel 14, may appear in the window 304 when the UHF tuner 20 is tuned to receive this channel. Furthermore, such dial calibration adjustment should preferably be made from the front panel of the television cabinet after the UHF tuner 20 and its drive mechanism has been assembled in the television receiver cabinet. Also, front panel adjustment is desirable from the standpoint of ease in servicing once the receiver is in the field.

Figure 5:
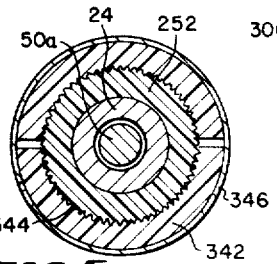
FIG. 5 is a sectional view taken along the lines 5—5 of FIG. 1.
Figure 9:
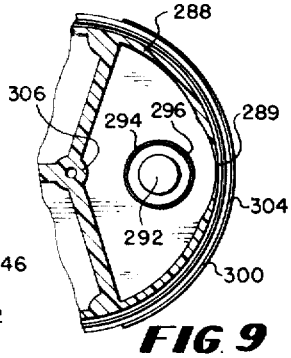
FIG. 9 is a sectional view taken along the lines 9—9 of FIG. 3.

In accordance with a further aspect of the invention, the split hub portion 342 of the gear 340 is provided with a series of longitudinally extending splines which match the splined portion 344 of the member 232 secured to the selector shaft 24, as best illustrated in FIG. 5. The provisions of these matching splines on the hub 342 and selector shaft portion 232 together with the clamping action of the spring clamp 346 insures that these members rotate together during normal operation while permitting these members to be rotated relative to one another by exerting a large separating force thereon during calibration. Accordingly, after the UHF tuner 20 and its associated drive mechanism and dial indicating mechanism has been assembled on the television chassis bracket 266 and the television receiver has been installed within the cabinet 240 but with the knobs 236 and 238 removed, a tubular adjustment member 360 (FIG. 4) may be inserted through the opening in the front panel 240 and over the retaining ring 256 to a position such that lugs 362 in the end of this tubular member engage corresponding openings in the web portion of the gear 340. The tubular member 360 is provided with a transversely extending handle portion 364. Another tubular member 366 is provided with an end portion 368 which is adapted to seat on the flatted end portion of the selector shaft 24, the member 366 fitting inside of the tubular member 360 and being provided with a knob portion 370 which may be gripped by the operator. The calibration of the dial strip 290 may then be easily made by simply holding the knob 370, which prevents the selector shaft 24 and the plastic sleeve member 232 secured thereto from rotating, while at the same time the arm portion 364 may be rotated in either direction, as desired, which results in rotation of the gear 340 and hence movement of the dial strip 290 past the viewing window 304. As this movement is accomplished by rotation of the member 360 relative to the member 366, the splined portions of the members 232 and 342 slip over each other since an extremely large force can be exerted by means of the lever arm 364. However, once the desired dial adjustment is achieved, which may be made by simple inspection of the number which appears in the window 304, the members 360 and 366 are removed and the spring clamp 346 holds the members 342 and 232 together during subsequent normal operation of the television tuner. The knobs 236 and 238 are then installed on their respective control shafts and the dial indication of each UHF television station is automatically provided in response to rotation of the station selector knob 238. A similar adjustment of the dial indicator may be made in the field by simply removing the knobs 236 and 238, inserting the tubular members 360 and 366 in the manner described in detail heretofore, and adjusting the member 360 until the desired channel member registration is achieved.

In the embodiment of FIGS. 1 to 14, inclusive, a tuning knob arrangement similar to a conventional UHF television tuner is provided wherein the fine tuning knob 236 is positioned outside of the station selector knob 238. However, if desired, a simpler control shaft arrangement may be employed wherein a modified fine tuning control shaft 50a is made to extend out through the center of a one-piece molded selector shaft similar to the plastic shaft portion 232, which would then extend beyond the cabinet for knob actuation. The fine tuning sleeve 250 and associated components, together with the metal selector shaft 24, are eliminated in such an arrangement. Under such conditions, any suitable knob arrangement may be employed whereby the selector shaft may be rotated by means of an outer knob to select a desired UHF station and the modified fine tuning shaft may thereafter be rotated by means of an inner knob to provide any necessary fine tuning for that particular UHF station. For example, a knob arrangement similar to that described in detail in said Valdettaro application Ser. No. 233,148 may be employed with such a simplified control shaft arrangement.

In FIGS. 15 and 16 of the drawings, an alternative embodiment of the invention is shown wherein the elongated indicator strip 380 is made of metal, such as stainless steel, or other material which can hold a prestressed tight curl under normal operating conditions as described in detail hereinafter, and is prestressed so that portions of the indicator strip which are positioned within the compartments 382 and 384 of the housing 386 tend to maintain a tightly curled coil, such as the coils 388 and 390 in the chambers 382 and 384, respectively.

In the embodiment of FIGS. 15 and 16, the gear driven spools 318 and 320 of the embodiment of FIGS. 1 to 14, inclusive, are eliminated, since the precurled strip 380 may be pushed into the compartments 382 or 384 by engagement of the drive lugs 392 with corresponding sprocket holes in the strip 38 without jamming against the walls of the compartments 382 and 384. The drive lugs 392 are formed in the upstanding flange portion 394 of a rotatable strip drive member 396 which is loosely mounted on the center post 398 of the top housing member 386 and rests on a central retainer plate 400 which is secured to the center post 398 by means of the screw 402. To rotate the member 396 it is provided with a crown gear portion 404, which is similar to the crown gear 338 of the drive member 326 in the embodiment of FIGS. 1 to 14, and is in mesh with the gear 340 on the selector shaft 24.

The prestressed curl of the indicator strip 380 is preferably obtained by heating the tightly coiled strip to a relatively high temperature well above the ambient temperature to which the tuner will be exposed during actual operation or storage, so that the strip retains its tendency to form the tightly coiled portions 388, 390 even under extreme ambient temperature operating conditions. In this connection, it will be understood that when the indicator strip is made of flexible or pliant material, such as Mylar or acetate, which is not precurled, it is not possible to utilize the arrangement shown in FIGS. 15 and 16 wherein the supply and takeup spools are eliminated, since the required length of this flexible material cannot be pushed into one of the relatively small size compartments 382 or 384 without causing it to jam against the walls of these compartments and thereby prevent further movement of the indicator strip in response to rotation of the drive member 396.

If the precurled indicator strip 380 in the embodiment of FIGS. 15 and 16 is made of metal, the channel numbers are preferably imprinted on the outer surface thereof and may comprise, for example, white numbers on a black background, so that the channel numbers printed on the strip 380 may be directly viewed by ambient light from the front of the television cabinet. With such an arrangement, the internal pilot light 292 of FIGS. 1 to 14, inclusive, may be eliminated. However, a mask member 406, which is similar to the light mask 300, may be employed in FIGS. 15 and 16 so that only one of the channel numbers on the strip 380 is viewable through the viewing opening 408 thereof. In other respects, the embodiment of FIGS. 15 and 16 may be substantially identical to the embodiment described in detail heretofore in connection with FIGS. 1 to 14, inclusive. In this connection, it is noted that the channel members may be cut out of such a metal strip indicator 380 and the pilot light 292 employed but with such an arrangement the sharp protruding edges of the strip adjacent each channel number tend to prevent proper coiling of the strip 380 within the compartments 382 and 384.

The precurled indicator strip 380 of FIGS. 15 and 16 is preferably of metal, because metal may be heated to a much higher temperature during the initial curl forming operation without melting or deforming of the strip as would occur with a Mylar or acetate strip. This means that a metal indicator strip 380 may be operated at a high ambient temperature during use of the tuner and still not lose its tendency to form a tight curl because this high operating temperature is still much lower than the temperature at which the curl was formed initially. However, a non-metallic precurled indicator strip may be utilized in certain instances where the forces tending to cause the strip to lose its curl are minimized. For example, if smaller channel numbers or closer spacing between numbers is permitted, the total length of the indicator strip 390 will be decreased and fewer turns of the strip are required to cover the entire UHF band. Also, if an extremely thin indicator strip of Mylar or acetate is used, having a thickness in the order of 0.0025 inches, the strip will be very pliant and flexible and less internal forces are available to develop in terturn friction between turns of the coil, or friction between the strip and the walls of the compartments 382 and 384, than with a thicker and hence a stiffer strip of the same number of turns. Furthermore, the structure of the present invention, wherein the strip 380 pushes out against the rim portion 394 of the member 396 and is driven at several points along this rim by means of the lugs 392, provides a drive arrangement by means of which a very thin indicator strip 380 can be moved into either one of the compartments 382 or 384 without buckling. It should also be noted that with the structure of the present invention, the indicator strip is never straightened out completely or given a bend in the reverse direction from the prestressed curl during the entire movement of the indicator strip from one compartment to another. Accordingly, a strip 380 of nonmetallic material may in some instances be utilized in the embodiment of FIGS. 15 and 16 provided the temperature to which this strip is subjected is far enough removed from the temperature at which the curl is initially formed that the curl memory is not entirely lost. In this connection, it will be understood that the curl memory can be partially lost, as for example, when a portion of the strip 380 is positioned over the larger radius of the housing 386 for extended periods of time, and yet the strip can be pushed into one of the compartments 382 or 384 and form a spiral against the walls of this compartment without jamming, if a relatively short length of strip material which is very thin and pliant, is employed, as described heretofore.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to type having secured by Letters Patent of the United States is:

1. In a UHF tuning mechanism of the type having a continuously variable main tuning shaft rotation of which is effective selectively to receive signals from all television stations in the UHF television band, the combination of a station selector shaft, gear means interconnecting said selector shaft and said main tuning shaft, detent means connected to said selector shaft for establishing a plurality of equally spaced detent positions for said selector shaft so that all of the stations in said UHF band may be selected by rotating said selector shaft more than one revolution, an elongated strip of material bearing numbers corresponding to the assigned channels of each of the 70 UHF television stations, means defining a viewing position at which a single one of said numbers may be viewed, driving means for moving said elongated strip past said viewing position, and means interconnecting said selector shaft and said driving means, said numbers being spaced at equal intervals along the length of said strip so that the number on said elongated strip which corresponds to each stop position of said main tuning shaft is selectively moved to said viewing position in response to rotation of said selector shaft and is positioned in correct registration with said viewing position by said selector shaft detent means.

2. The combination of claim 1 wherein said elongated strip is provided with holes along at least one edge thereof, and said driving means includes a sprocket member mounted for rotation about an axis perpendicular to said selector Shaft and including an annular flange having radially inwardly extending projections adapted to engage said holes in said strip.

3. The combination of claim 2, which includes means defining a pair of chambers within which the ends of said elongated strip are positioned as the intermediate portion of said strip is moved past said viewing position, said pair of chambers being positioned within the profile of said annular flange, thereby to provide a compact dial indicator for the detent positions of said selector shaft.

4. The combination of claim 1, which includes a pair of rotatably mounted spools, means securing the ends of said elongated strip to said spools, and means for rotating said spools in sychronism with said driving means, said strip being so loosely wound on each of said spools that the channel numbers on said strip may be moved past said viewing position without causing said strip to be wound tightly on either one of said synchronously driven spools during movement of said strip to either end of the UHF band.

5. The combination of claim 1, wherein said viewing position is defined by a masking member having a window through which a portion of said strip may be viewed, and a light source positioned to direct light outwardly through said strip so that a single channel number is clearly visible through said window.

6. The combination of claim 5, wherein said strip is made of transparent material, and said channel numbers are defined by a relatively opaque background outlining said channel numbers in said transparent material.

7. The combination of claim 1, wherein said viewing position is defined by a masking member having a window through which a portion of said strip may be viewed, said elongated strip is made of opaque material, and said channel numbers are formed of contrasting, light reflective material which can be distinguished from said strip material by ambient light passing through said window.

8. The combination of claim 1, wherein said viewing position is defined by a masking member having a window through which a portion of said strip may be viewed, said strip is made of transparent material and said channel numbers defined by relatively opaque areas on said strip, and means defining a light reflective area behind said strip in the area of said window, whereby ambient light passes through said window and said strip strikes said light reflective area so as to illuminate said channel numbers.

9. In a UHF tuning mechanism of the type having a continuously variable main tuning shaft rotation of which is effective selectively to receive signals from all television stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the 70 UHF television stations and provided with holes along at least one edge thereof, means defining a viewing position at which one of said channel numbers may be viewed, driving means for moving said elongated strip past said viewing position and including a sprocket member mounted for rotation about an axis perpendicular to said selector shaft and having projections adapted to engage said holes in said strip, means for interconnecting said selector shaft and said driving means, said channel numbers being spaced along the length of said strip so that each number is selectively moved to said viewing position in response to rotation of said selector shaft, a pair of rotatably mounted spools, means securing the ends of said elongated strip to said spools, a driven gear for each of said spools, a driving gear in engagement with said spool gears, and means for rotating said driving gear in synchronism with said selector shaft.

10. In a UHF tuning mechanism of the type having a continuously variable main tuning shaft rotation of which is effective selectively to receive signals from all television stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the 70 UHF television stations, means defining a viewing position at which one of said channel numbers may be viewed, driving means for moving said elongated strip past said viewing position, means for interconnecting said selector shaft and said driving means, said channel numbers being spaced along the length of said strip so that each number is selectively moved to said viewing position in response to rotation of said selector shaft, said interconnecting means including a gear concentric with said selector shaft and rotatable therewith, slip clutch means between said gear and said selector shaft, said slip clutch means normally transmitting rotation of said selector shaft to said gear and being arranged to slip when a larger-than-normal force is exerted between said gear and said selector shaft to permit adjustment of said strip relative to said viewing position at a particular detent position of said selector shaft.

11. The combination of claim 10 wherein said gear is provided with a split hub portion, and spring clamp means for securing said gear to said selector shaft so that said gear is normally rotated with said selector shaft while permitting adjustment of said gear relative to said selector shaft when said larger-than-normal force is exerted thereon.

12. The combination of claim 10, wherein said slip clutch means comprises a series of mating grooves and ridges on the adjacent surfaces of said gear and said selector shaft.

13. In a UHF tuning mechanism of the type having a continuously variable main tuning shaft rotation of which is effective selectively to receive signals from all television stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the 70 UHF television stations, means defining a viewing position at which one of said channel numbers may be viewed, driving means for moving said elongated strip past said viewing position, means for interconnecting said selector shaft and said driving means, said channel numbers being spaced along the length of said strip so that each number is selectively moved to said viewing position in response to rotation of said selector shaft, said interconnecting means including a gear concentric with said selector shaft, and means for adjustably shifting said gear relative to said selector shaft so that the position of said strip relative to said viewing position may be adjusted at a particular detent position of said selector shaft without altering the position of said main tuning shaft.

14. The combination of claim 13, which includes a cabinet having an opening in one wall thereof through which said selector shaft extends, and means on said gear and adapted to be engaged by a tool inserted through said opening for adjustably shifting said gear relative to said selector shaft, whereby said elongated strip of material may be adjusted relative to the particular detent position of said selector shaft.

*15. In a UHF tuning mechanism of the type having a continuously variable main tuning shaft, rotation of which is effective selectively to receive signals from all seventy television stations in the UHF television band, the combination of a station selector shaft, gear means interconnecting said selector shaft and said main tuning shaft, detent means connected to said selector shaft for establishing a plurality of equally spaced detent positions for said selector shaft so that all of the stations in said UHF band may be selected by rotating said selector shaft more than one revolution, a movable mounted elongated strip of material bearing numbers corresponding to the assigned channels of each of the seventy UHF television stations, means defining a stationary single number viewing position at which only one of said numbers may be viewed at a time, driving means for moving said elongated strip past said viewing position, and means interconnecting said selector shaft and said driving means so that each UHF channel number on said elongated strip which corresponds to a detent position of said main tuning shaft is automatically viewable at said viewing position in response to rotation of said selector shaft.*

*16. The combination of claim 15, wherein said detent means for said selector shaft is also effective to position each of said numbers on said strip in correct registration with said stationary single number viewing position.*

*17. The combination of claim 15, wherein said numbers are individually spaced at equal intervals along the length of said elongated strip and said interconnecting means is effective to move a different one of said numbers into said stationary single number viewing position in response to movement of said selector shaft to different ones of said detent positions.*

*18. The combination of claim 15, wherein said elongated strip is provided with holes along at least one edge thereof, and said driving means includes a sprocket member mounted for rotation about an axis perpendicular to said selector shaft and having projections adapted to engage said holes in said strip.*

*19. In a UHF tuning mechanism of the type having a continuously variable main tuning shaft rotation of which is effective selectively to receive signals from all seventy televison stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the seventy UHF television stations and provided with holes along at least one edge thereof, means defining a viewing position at which one of said channel numbers may be viewed, driving means for moving said elongated strip past said viewing position and including a sprocket member mounted for rotation about an axis perpendicular to said selector shaft*

*and having projections adapted to engage said holes in said strip, means for interconnecting said selector shaft and said driving means, said channel numbers being spaced along the length of said strip so that each number is selectively moved to said viewing position in response to rotation of said selector shaft, a pair of rotatably mounted spools, a driven gear for each of said spools, a driving gear in engagement with said driven gears, means for rotating said driving gear in synchronism with said selector shaft, and means including said spools for coiling and uncoiling the ends of said strip as it is moved relative to said viewing position by said sprocket member.*

*20. In a UHF tuning mechanism of the type having a continuously variable main tuning shaft rotation of which is effective selectively to receive signals from all seventy television stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the seventy UHF television stations, means defining a viewing position at which one of said channel numbers may be viewed, driving means for moving said elongated strip past said viewing position, means for interconnecting said selector shaft and said driving means, said channel numbers being spaced along the length of said strip so that each number is selectively moved to said viewing position in response to rotation of said selector shaft, said interconnecting means including a gear concentric with said selector shaft, and means for adjustably positioning said gear on said selector shaft so that the position of said strip relative to said viewing position may be adjusted at a particular detent position of said selector shaft without altering the position of said main tuning shaft.*

*21. In a UHF tuning mechanism of the type having a continuously variable main tuning shaft rotation of which is effective selectively to receive signals from all seventy television stations in the UHF television band, the combination of, a station selector shaft, gear means interconnecting said selector shaft and said main tuning shaft, detent means for said selector shaft to establish a plurality of equally spaced detent positions for said selector shaft so that all of the stations in said UHF band may be selected by rotating said selector shaft more than one revolution, an elongated strip of material bearing numbers corresponding to the channel numbers assigned to each of the seventy UHF television stations, means defining a viewing position at which one of said channel numbers may be viewed, driving means for moving said elongated strip past said viewing position, means for interconnecting said selector shaft and said driving means, said channel numbers being spaced along the length of said strip so that each number is selectively moved to said viewing position in response to rotation of said selector shaft, said interconnecting means including slip clutch means normally transmitting rotation of said selector shaft to said driving means and being arranged to slip when a larger-than-normal force is exerted, thereby to permit adjustment of said strip relative to said viewing position at a particular detent position of said shaft.*

* * * * *

UNITED STATES PATENT OFFICE

CERTIFICATE OF CORRECTION

Patent No. Re. 30,062 Dated August 7, 1979

Inventor(s) Alarico A. Valdettaro

It is certified that error appears in the above-identified patent and that said Letters Patent are hereby corrected as shown below:

Column 16, line 22, "movable" should read --movably--;

Claims 22, 23 and 24 should be inserted as follows:

--22. The combination of claim 1, which includes means for adjustably shifting said driving means relative to said selector shaft so that the position of said elongated strip relative to said viewing position may be adjusted.

23. The combination of claim 15, which includes means for adjusting the position of said driving means relative to one of the detent positions of said selector shaft so that the position of a channel number on said strip may be adjusted relative to said viewing position.

24. The combination of claim 19, which includes means for adjusting the position of said sprocket member relative to said selector shaft so that the position of said elongated strip may be adjusted relative to said viewing position.--

Signed and Sealed this

*Twenty-second* Day of *January 1980*

[SEAL]

*Attest:*

SIDNEY A. DIAMOND

*Attesting Officer*

*Commissioner of Patents and Trademarks*